US005218176A

United States Patent [19]

Meyer, Jr.

[11] Patent Number: 5,218,176

[45] Date of Patent: Jun. 8, 1993

[54] CUSTOM FEATHERLIGHT MUSICAL SPEAKER ENCLOSURES

[76] Inventor: Kurt K. Meyer, Jr., Mashentuck Rd., Danielson, Conn. 06239

[21] Appl. No.: 865,458

[22] Filed: Apr. 9, 1992

[51] Int. Cl.[5] .......................... A47B 81/00; H05K 5/00

[52] U.S. Cl. ..................................... 181/199; 181/151

[58] Field of Search ............... 181/146, 148, 149, 198, 181/199

[56] References Cited

U.S. PATENT DOCUMENTS 4,109,983 8/1978 Kinoshita ............................ 181/199

4,596,305 6/1986 Jagborn ............................... 181/151

4,964,482 10/1990 Meyer ................................ 181/146

*Primary Examiner*—Michael L. Gellner

*Assistant Examiner*—Eddie C. Lee

*Attorney, Agent, or Firm*—J. Gibson Semmes

[57] ABSTRACT

Lightweight speaker cabinets manufactured from acoustical composite panels having unique acoustical and structural properties, include an acoustical composite laminate consisting of a porous inner core of closed cell rigid urethane foam which is bonded to fiberglass rovings or skin by means of polyester resin and resin tie blocks, interconnecting the exterior and interior roving and core.

1 Claim, 2 Drawing Sheets

CUSTOM FEATHERLIGHT MUSICAL SPEAKER ENCLOSURES

BACKGROUND OF INVENTION

Historically, acoustical speaker cabinets have been constructed of wood and wooden by-products such as particle board and plywood. In applications of live music broadcast where speaker enclosures may be constantly transported from performance to performance, there is provided herein an acoustically stable structural material which not only satisfies the need of structural integrity and durability but also allows for a minimum weight savings of at least 50% over conventional speaker enclosures. Suspended or so-called flying systems as utilized in large civic centers and auditoriums would be enhanced due to these lighter components reducing roof load stresses. Panels of the lightweight material herein are hand laminated into 48 inch and one hundred twenty inch sheets wherein construction and bonding is accomplished through the utilization of polyester resin, one and two part epoxy systems and hot melt adhesive applications.

The construction laminate detail hereinafter defined comprises a sandwich of twenty four ounce fiberglass roving with polyester resin impregnation on either side of a U190 urethane foam core. Polyester resin skin tie blocks are used as panel stiffeners and support anchors.

SUMMARY OF INVENTION

The invention comprises a lightweight speaker cabinet construction wherein a urethane foam core is sandwich-contained by fiberglass roving having polyester resin impregnation to which are bonded on their interior surfaces plural polyester resin skin tie blocks extending through the urethane foam. A unique step-by-step process for the manufacture of the material comprising the cabinet is employed. The essence of the invention resides in the acoustical and structural properties of Fiberform (TM). This is an acoustical composite laminate consisting of a porous inner core of closed cell rigid urethane foam which is bonded to a fiberglass roving or skin by means of polyester resin and resin tie blocks. The porous inner core of the laminate not only creates its own high damping factor, allowing for a smooth frequency response, but it also has a lower resonant frequency than wood and wooden by-products, which provides a smoother bass and midrange response and an overall warm sound.

DESCRIPTION OF THE PREFERRED EMBODIMENTS

Figure 1:
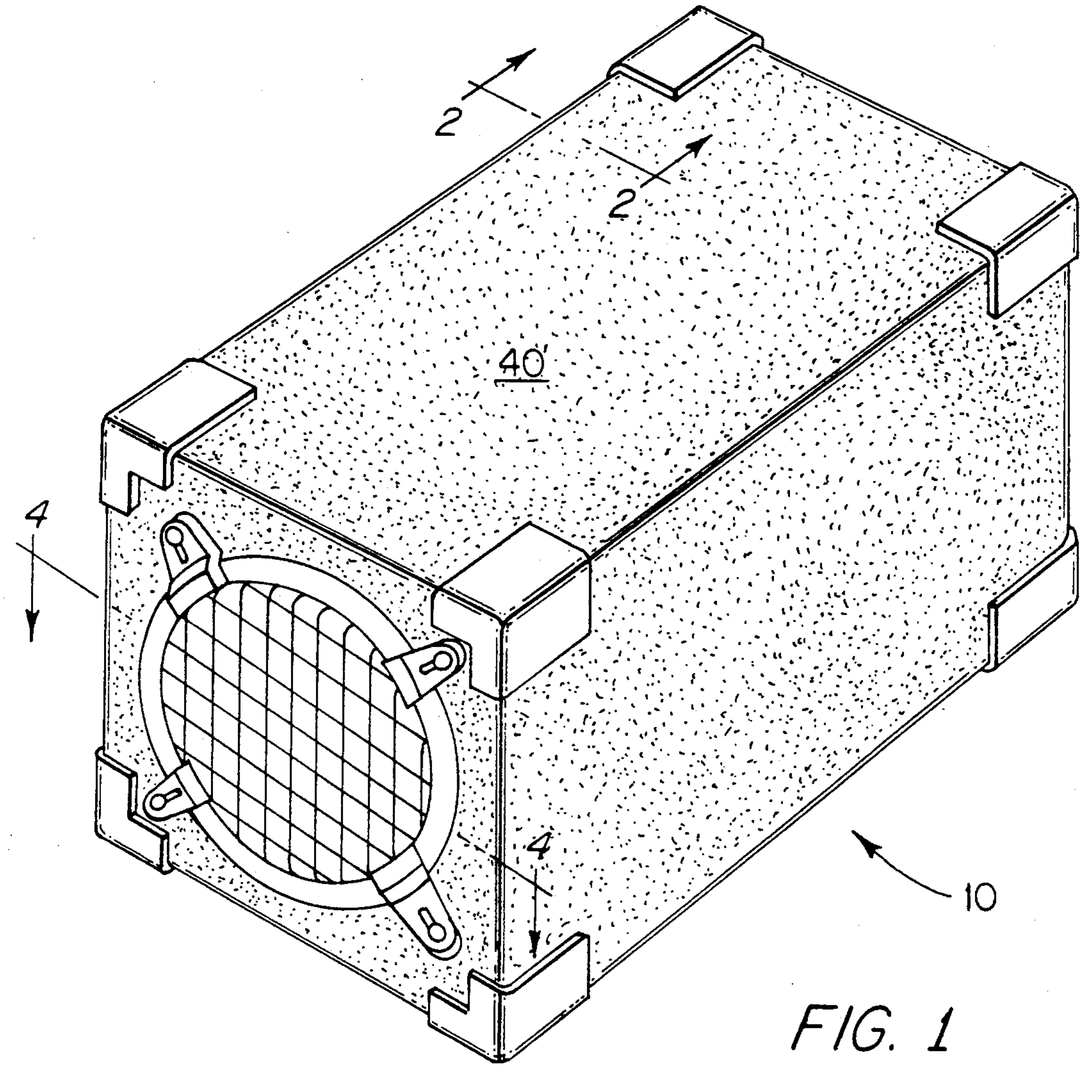
FIG. 1 is a view in the perspective of a speaker cabinet manufactured in accordance with the invention.
Figure 2:
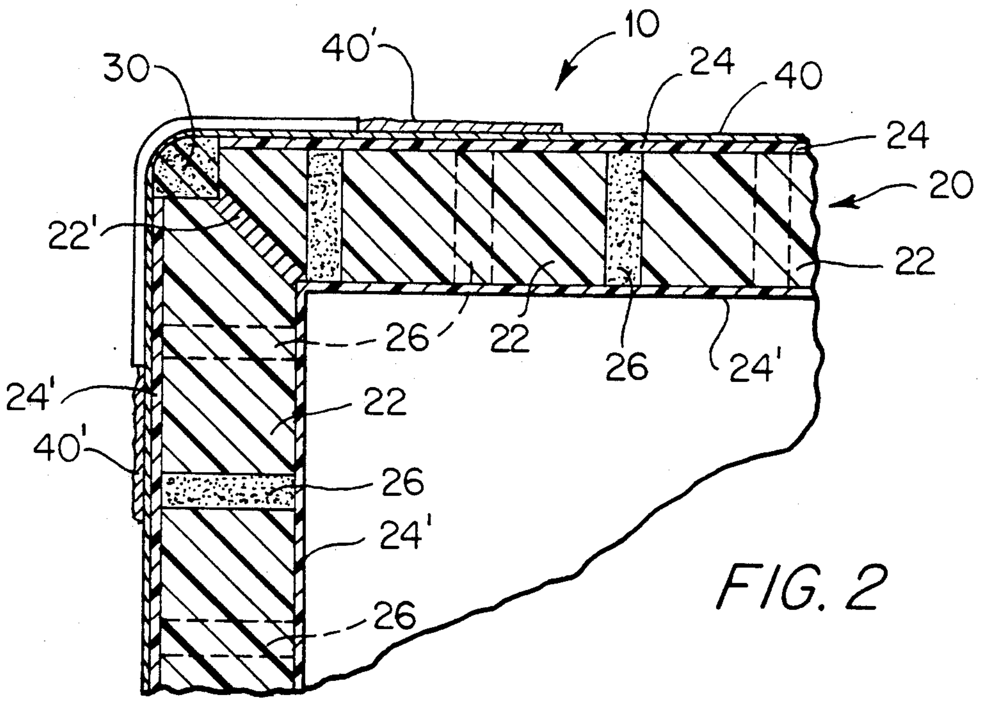
FIG. 2 is a horizontal sectional view of the invention taken along the lines 2—2 of FIG. 1.
Figure 3:
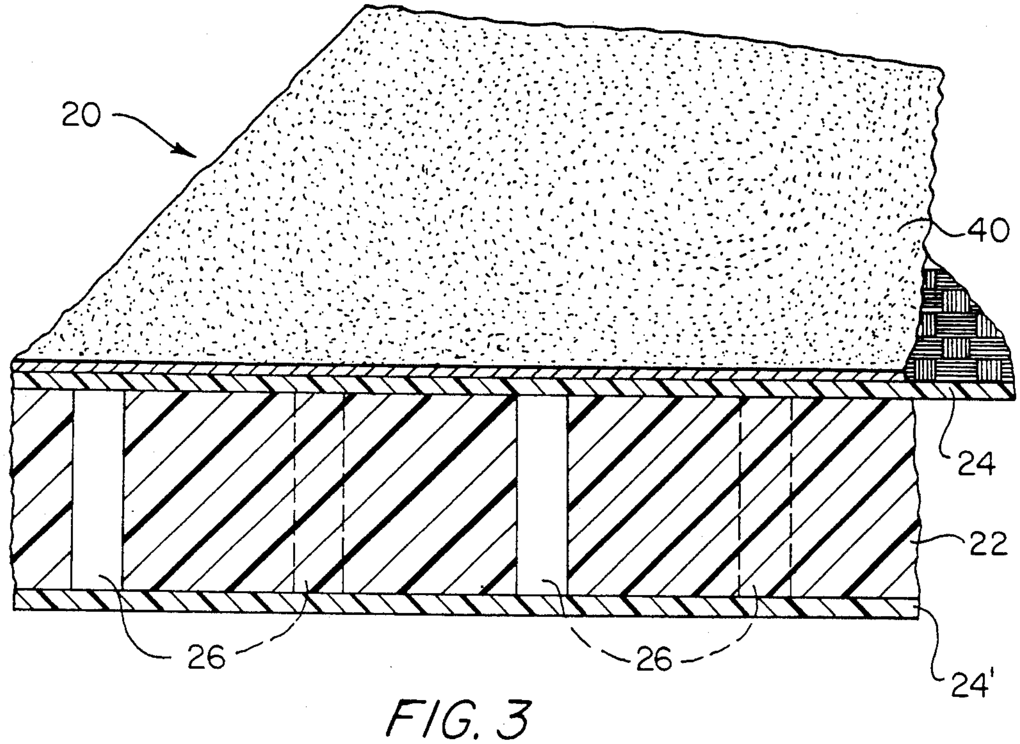
FIG. 3 is an enlarged section of a composite laminate prepared in accordance with the invention.
Figure 4:
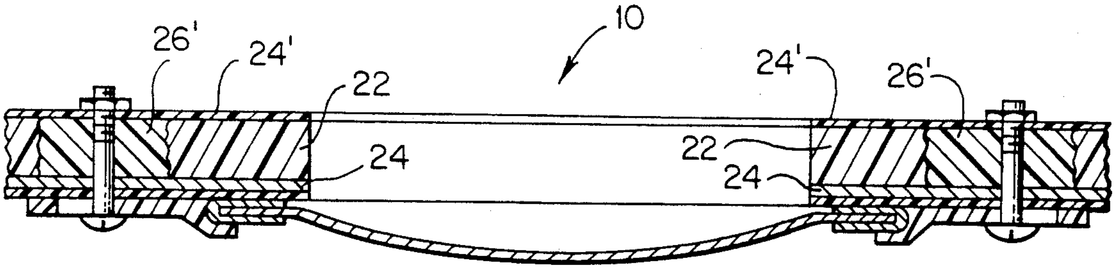
FIG. 4 is a horizontal section view of the invention taken along the lines of 4—4 of FIG. 1 in illustration of the speaker cabinet corner.

Referring to the drawings, FIG. 1 illustrates acoustical speaker cabinet 10 comprising an enclosure which is adapted to contain all of the conventional hardware including a speaker or two, the cabinet securing a speaker grill.

The cabinet construction comprises an acoustical composite laminate 20 consisting of a porous inner core 22 preferably of rigid urethane foam, which is bonded to a fiberglass roving 24–24'. The core 22 comprises a urethane foam having the density of approximately 1.9 lbs. per cubic foot, indentified as Dow U190 (TM). The porous inner core of laminate not only creates its own high damping factor, allowing for a smooth frequency response, but it also has a lower resonant frequency than obtained through wood and wooden by-products, developing a smoother bass and midrange response and an overall warm sound. As indicated, the speaker cabinet utilizing the closed cell rigid urethane foam U190 (TM) is of composite construction wherein the core is bonded externally and internally by roving 24–24', the roving comprising a twenty-four oz. woven fiberglass cloth with a polyester resin impregnation. There are both exterior and interior skins of the roving 24–24'. The core 22 is penetrated and the penetrations filled with polyester resin skin tie blocks or bosses 26. These structural bosses, together with the fiberglass rovings, lend structural integrity to the acoustical composite 20, the same having bonded interconnection with the rovings 24–24'.

A gel coat 40 is applied to the laminate, permitting easy mold pop off and leaving a very smooth exterior skin for the composite 20 presenting a suitable finish coating surface. To this exterior is applied a Wurth (TM) coating adapted from German automotive finishes, rendering the exterior flexible and resistant to common wear and ultra violet rays, as when used in outdoor applications.

As indicated, the preferred roving 24–24' comprises a woven broadcloth of twenty-four oz. fiberglass which when impregnated with polyester resin permits heavy resin content impregnation, forming a one-sixteenth inch/0.0625 inch outer shell of laminate material. This is due to the basket weave of the cloth, an example of which is indicated in the drawings.

The speaker enclosures are now assembled with a hot melt single part adhesive. The corners and edges are finished with a Bostick (TM) product, #1000 flexible urethane, 30. The flexible adhesives prevent delamination from occuring if the cabinets should be dropped or bumped agressively while transporting, while still maintaining complete cabinet integrity and strength.

In the fabrication process, the following pertains. Using a hand lay-up method, a 48" by 120" panel is constructed in this order:

1) Five sheets, 24"×48", of urethane foam are perforated at 1½" intervals to allow resin saturation to occur between both laminate skins, reducing panel flex while aiding panel rigidity.

2) Three pounds of polyester gel coat are applied on a laminate table, constructed with a Formica (TM) top allowing for easy mold panel pop-off.

3) 14 pounds of catalyzed polyester resin are mixed and a layer of 24 oz. fiberglass woven roving is placed on the cured gel coated laminate table. Utilizing a squeegee, saturate the fiberglass with ample resin mixture, being sure to remove all air pockets. Once saturated, coat each foam panel with more resin mixture and press each 24"×48" sheet into place creating a 48"×120" panel. Mix 12 pounds more of catalyzed resin and coat the foam on the remaining face, making sure the resin mixture has fully flowed through all panel perforations to the outer gel coated skin. Place another layer of 24 oz. woven fiberglass on the resin coated foam, and squeegee in the remaining resin again being sure to work out any trapped air.

4) After the panel has cured, usually within four to six hours unless force heated, the panel can easily be pried and popped off the laminate mold table.

5) After the panels are cut to the proper size for cabinet requirements, the cabinets are assembled utilizing a hot melt glue system, and if necessary are reinforced internally by the adaptation of sections of core laminate as required to sustain high impact resistance, eliminate side panel flex, and/or to support heavy hardware.

The cabinet panels may be reinforced by the adhesion of sections of core laminate where required to sustain high impact resistance and/or support heavy hardware. An example of such reinforcement includes adhering a panel section at right angle to a main panel to form a diagonal brace. A bulk hot melt glue adhesive insures a fixed bond between the main panel and its reinforcement to brace the cabinet against panel flex and/or movement frequency problems.

Panels are assembled together with a hot melt single part adhesive, the cabinet corners and panel edges being specifically assembled with a hot melt single part adhesive 22'and the corners and edges finished with a Bostick (TM) product, #1000 flexible urethane 30. The flexible adhesives prevent delamination from occuring if the cabinets should be dropped or bumped aggressively while transporting, while still maintaining complete cabinet integrity and strength.

I claim:

1. A lightweight speaker cabinet formed of acoustical composites, having enhanced acoustical and structural properties, comprising;

A) top, bottom, end and side panels each being composed of an acoustical composite laminate, the laminate consisting of a porous inner core of closed cell rigid urethane foam, said panels being joined together at corners, edges thereof being sealed together by a hot melt single part adhesive, finished with a flexible urethane adhesive;

B) at least one external and one internal woven broadcloth fiberglass roving, impregnated with polyester resin and resin bonded to the laminate on opposite sides thereof; the rovings retaining by bonding a woven broadcloth of fiberglass, impregnated with polyester resin;

C) resin tie blocks interconnecting respective exterior and interior rovings to panel cores, said tie blocks being sealed to the core from surface to surface thereof.

* * * * *